(12) United States Patent
Okabayashi

(10) Patent No.: US 8,137,806 B2
(45) Date of Patent: Mar. 20, 2012

(54) THERMAL DIFFUSION SHEET AND METHOD FOR POSITIONING THERMAL DIFFUSION SHEET

(75) Inventor: Yoshiaki Okabayashi, Sano (JP)

(73) Assignee: Polymatech Co., Ltd., Tokyo (JP)

( * ) Notice: Subject to any disclaimer, the term of this patent is extended or adjusted under 35 U.S.C. 154(b) by 883 days.

(21) Appl. No.: 12/019,059

(22) Filed: Jan. 24, 2008

(65) Prior Publication Data
US 2008/0289810 A1  Nov. 27, 2008

(30) Foreign Application Priority Data

Feb. 1, 2007 (JP) ................. 2007-023318

(51) Int. Cl.
*B32B 7/12* (2006.01)
*B32B 15/04* (2006.01)
*F28F 7/00* (2006.01)
*H05K 5/00* (2006.01)

(52) U.S. Cl. ..... 428/343; 165/79; 165/185; 361/679.01; 361/704; 361/707

(58) Field of Classification Search .......... 428/343, 428/344, 40.1, 40.9; 165/79, 185; 361/679.01, 361/679.46, 688, 696, 697, 704, 707, 709–713
See application file for complete search history.

(56) References Cited

U.S. PATENT DOCUMENTS

| | | | | |
|---|---|---|---|---|
| 4,602,678 A | * | 7/1986 | Fick | 165/79 |
| 5,831,374 A | | 11/1998 | Morita et al. | |
| 6,097,598 A | * | 8/2000 | Miyahara et al. | 361/704 |
| 6,131,651 A | * | 10/2000 | Richey, III | 165/185 |
| 2005/0117305 A1 | | 6/2005 | Ulen et al. | |
| 2006/0086493 A1 | | 4/2006 | Fujiwara et al. | |

FOREIGN PATENT DOCUMENTS

| | | |
|---|---|---|
| CN | 1161621 A | 10/1997 |
| CN | 2283276 Y | 6/1998 |
| JP | 6216284 A | 8/1994 |
| JP | 11-87959 A | 3/1999 |
| JP | 2000-81143 A | 3/2000 |
| JP | 2002-12485 A | 1/2002 |
| JP | 2004023065 A | 1/2004 |
| JP | 2004023066 A | 1/2004 |
| JP | 2005150249 A | 6/2005 |
| TW | 443529 Y | 6/2001 |
| TW | 224123 B | 11/2004 |
| TW | 300833 Y | 11/2006 |
| WO | 2005048298 A2 | 5/2005 |

* cited by examiner

*Primary Examiner* — Patricia Nordmeyer
(74) *Attorney, Agent, or Firm* — Seager, Tufte & Wickhem LLC

(57) ABSTRACT

A thermal diffusion sheet is provided with a graphite sheet for diffusing heat generated by a heat emitting body and a polymer film provided on the graphite sheet. The thermal diffusion sheet is provided with a positioning portion for carrying out positioning relative to the heat emitting body.

4 Claims, 3 Drawing Sheets

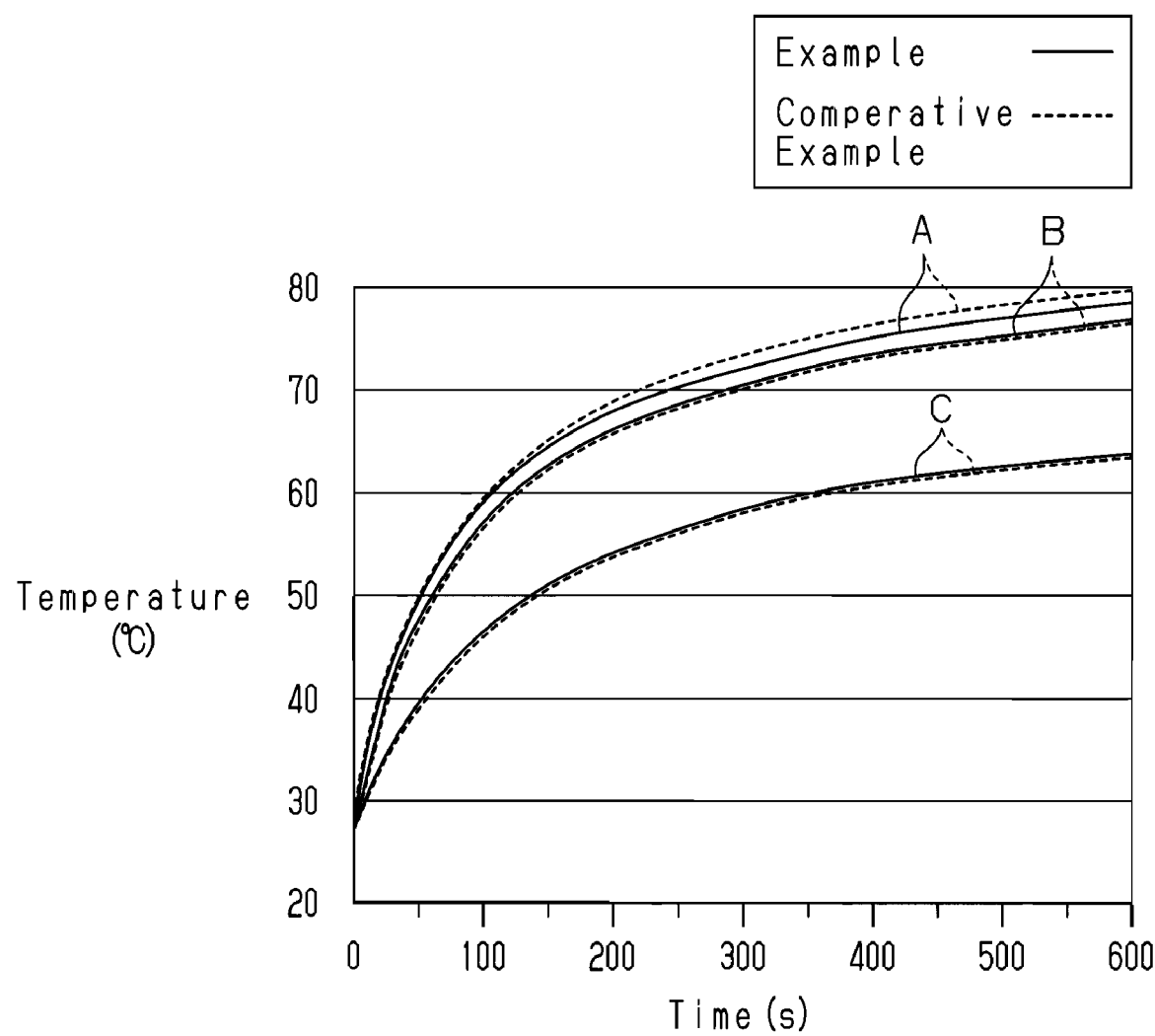

THERMAL DIFFUSION SHEET AND METHOD FOR POSITIONING THERMAL DIFFUSION SHEET

BACKGROUND OF THE INVENTION

The present invention relates to a thermal diffusion sheet for diffusing heat generated by a heat emitting body, such as an electronic part.

In recent years, the amount of power consumed in electronic parts, for example, central processing units (CPUs) and integrated circuits (ICs), and the amount of heat emitted from these parts have been increasing along with the performance of computers. The processing performance of electronic parts decreases due to heat, and therefore, it is necessary to prevent the temperature from rising due to the heat from the electronic parts. In this connection, a configuration is known in which a thermal diffusion sheet, for example, a graphite sheet, is placed between electronic parts and a housing. Graphite sheets have anisotropic thermal conductivity in such a manner that the thermal conductivity in the direction parallel to the surfaces, that is to say, in the direction of the plane, is much higher than that in the direction of the thickness. Therefore, when a graphite sheet is placed between the electronic parts and the housing, the heat generated by the electronic parts is radiated while being diffused, and thus, the performance of the electronic parts is prevented from decreasing due to a rise in the temperature.

Japanese Laid-Open Patent Publication No. 11-087959, for example, discloses a heat radiating apparatus that is provided with a collector, which is heat collecting means, a flexible heat conducting device, which is led out from the collector, and a heat pipe, which is heat transferring means. In the case of this heat radiating apparatus, the flexible heat conducting device is formed by layering a plastic sheet on top of a graphite sheet. Japanese Laid-Open Patent Publication No. 2000-081143 discloses a packing material made up of a multilayer body in which graphite films and plastic films are alternately layered on top of each other. Japanese Laid-Open Patent Publication No. 2002-012485 discloses a method for coating the two sides of a graphite sheet with an epoxy resin.

Incidentally, thermal diffusion sheets as described above are pasted to electronic parts, such as CPUs and ICs, through manual operations or by a machine in the manufacturing process for electronic devices and the like. These electronic parts are very small, and therefore, it is very difficult to accurately paste a thermal diffusion sheet in a predetermined location. In addition, heat generated by the electronic parts cannot be efficiently radiated when the thermal diffusion sheet is not accurately pasted in the right location, and there is a risk that the performance of the electronic parts may decrease due to a rise in the temperature. For these reasons, a thermal diffusion sheet which can be easily and precisely positioned relative to a heat emitting body, such as an electronic part, is in strong demand.

SUMMARY OF THE INVENTION

An objective of the present invention is to provide a thermal diffusion sheet which can be easily and reliably positioned relative to a heat emitting body, such as an electronic part.

To achieve the foregoing objective and in accordance with a first aspect of the present invention, a thermal diffusion sheet is provided. The thermal diffusion sheet includes a graphite sheet for diffusing heat generated by a heat emitting body, a polymer film provided on the graphite sheet, and a positioning portion for carrying out positioning relative to the heat emitting body.

In accordance with a second aspect of the present invention, a method for positioning the thermal diffusion sheet according to the first aspect of the present invention relative to a heat emitting body is provided. The positioning of the thermal diffusion sheet relative to the heat emitting body is carried out by engaging a structure placed in close proximity to the heat emitting body with the positioning portion.

BRIEF DESCRIPTION OF THE DRAWINGS

FIG. 7 is a graph showing the results of evaluation tests.

DETAILED DESCRIPTION OF THE PREFERRED EMBODIMENTS

A thermal diffusion sheet according to one embodiment of the present invention is described below in reference to FIGS. 1 to 7.

Figure 1:
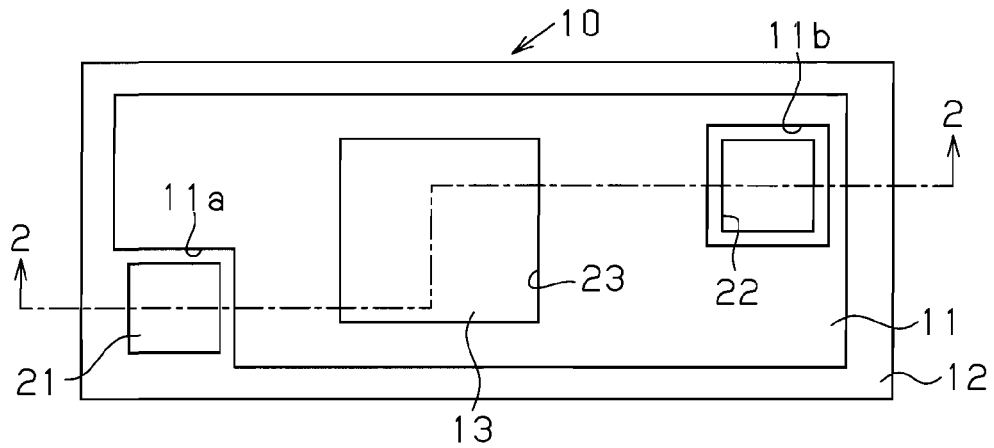
FIG. 1 is a top view showing a thermal diffusion sheet according to one embodiment.
Figure 2:
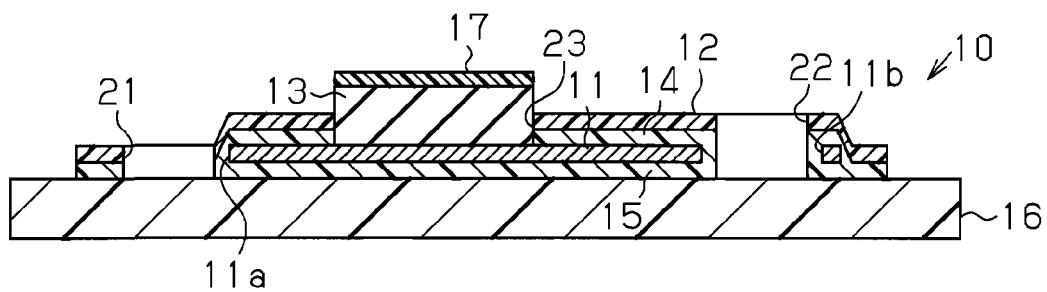
FIG. 2 is a cross-sectional view taken along line 2-2 of FIG. 1.

As shown in FIGS. 1 and 2, a thermal diffusion sheet 10 is provided with a graphite sheet 11, a polymer film 12, and a heat conductive rubber 13, which are provided on the graphite sheet 11. The thermal diffusion sheet 10 is pasted to an electronic part, which is a heat emitting body, and thus is used to prevent the temperature from rising due to the heat generated by the electronic part.

A notch 11a having a right angle is made in a left corner portion of the graphite sheet 11 shown in FIG. 1. In addition, a square hole 11b is made in the graphite sheet 11 in the vicinity of the corner portion on the side opposite to the notch 11a.

The two sides and the outer periphery of the graphite sheet 11 as well as the inner peripheries of the notch 11a and the hole 11b are coated with an adhesive. The adhesive is applied to each surface of the graphite sheet 11 so as to be thin and have an approximately uniform thickness. Therefore, the upper surface of the graphite sheet 11, on which the polymer film 12 is placed, is provided with a first adhesive layer 14, which is an upper adhesive layer, and the surface on the side opposite to the polymer film 12 is provided with a second adhesive layer 15, which is a lower adhesive layer. The thermal diffusion sheet 10 is pasted to a peel-off sheet 16 through the second adhesive layer 15. An acryl-based adhesive, a urethane-based adhesive, a silicone-based adhesive, an epoxy-based adhesive, a natural rubber-based adhesive and the like may be used as the adhesive from the point of view that they can be applied so as to be thin and have a uniform thickness.

The polymer film 12 is planar so as to cover the entirety of the surface of the graphite sheet 11. The polymer film 12 is formed so as to be a rectangle which is slightly greater than the outer shape of the graphite sheet 11. The polymer film 12 has such a thickness as to sufficiently compensate for the strength of the graphite sheet 11, which has a brittleness, and not to affect the heat radiating properties of the graphite sheet 11. Specifically, it is preferable for the thickness of the polymer film 12 to be set in a range from 18 µm to 50 µm. In the case where the thickness of the polymer film 12 exceeds 50 µm, it becomes difficult for heat to be radiated from the surface of the polymer film 12, and thus, heat from the electronic part is accumulated between the graphite sheet 11 and the polymer film 12. Meanwhile, in the case where the thickness of the polymer film 12 is less than 18 µm, the strength of the thermal diffusion sheet 10 cannot be sufficiently secured. It is preferable to use polyethylene terephthalate (PET), polyethylene naphthalate (PEN), polyphenylene sulfide (PPS), polyethylene (PE), polypropylene (PP) and polyimide (PI), for example, as the material of the polymer film 12 from the points of view that a sufficient strength is provided and they are relatively easy to obtain.

A hole 23 is made at the center of the polymer film 12 in order to place the heat conductive rubber 13 in square form. The hole 23 has approximately the same form as the heat conductive rubber 13. In addition, the hole 23 is made so as to be slightly greater than the heat conductive rubber 13. The heat conductive rubber 13 is placed in this hole 23, and thus placed directly on the graphite sheet 11. That is to say, the heat conductive rubber 13 is placed so as to make contact with the surface of the graphite sheet 11 without the polymer film 12 in between. In the present embodiment, the heat conductive rubber 13 is pasted and secured to the graphite sheet 11 through the first adhesive layer 14. It is preferable for the heat conductive rubber 13 to be directly pasted and secured to the surface of the graphite sheet 11 without the first adhesive layer 14 in between from the point of view that the heat that has diffused in the graphite sheet 11 from electronic parts 1 is easily radiated.

The heat conductive rubber 13 is made of rubber, or a base material, in which a heat conductive filler is included. It is necessary for the heat conductive rubber 13 to be soft in order to increase the adhesion with the housing in close proximity to the electronic parts. From this point of view, an organic polymer material, for example, a gel or grease, may be used as the base material in addition to rubber. However, it is preferable to use an elastic body, such as rubber, from the points of view of stability in the form and ease of handling. In addition, it is preferable to use, for example, any of the powders of metal oxides, metal nitrides, metal carbides and metal hydroxides as the heat conductive filler from the point of view that they have high thermal conductivity. Specifically, aluminum oxide, boron nitride, silicon carbide, aluminum hydroxide, and magnesium oxide may be used. A peel-off sheet 17 is pasted to the surface of the heat conductive rubber 13 in order to protect the surface and prevent the surface from drying. The peel-off sheet 17 is made of the same sheet material as the above described peel-off sheet 16. The thermal diffusion sheet 10 is pasted to the surface of the electronic parts for use after the peel-off sheets 16 and 17 have been peeled.

The thermal diffusion sheet 10 has two positioning portions 21 and 22, which are holes, in order to make positioning easy relative to the electronic parts. The first positioning portion 21 is provided in a left corner portion of the thermal diffusion sheet 10. The first positioning portion 21 is placed inside the notch 11a so as to be at a distance from the graphite sheet 11. Namely, the first positioning portion 21 is placed in such a location as not to overlap the graphite sheet 11 as viewed from the top. That is to say, the first positioning portion 21 is a hole through the polymer film 12 and the first and second adhesive layers 14 and 15.

Meanwhile, the second positioning portion 22 is provided in the vicinity of the corner portion on the side opposite to the first positioning portion 21 in the thermal diffusion sheet 10. The second positioning portion 22 is made smaller than the hole 11b of the graphite sheet 11 and placed in the same location as the hole 11b. Namely, the second positioning portion 22 is placed in such a location as not to overlap the graphite sheet 11 as viewed from the top in the same manner as the first positioning portion 21. That is to say, the second positioning portion 22 is a hole also penetrating the polymer film 12 and the first and second adhesive layers 14 and 15.

Figure 3:
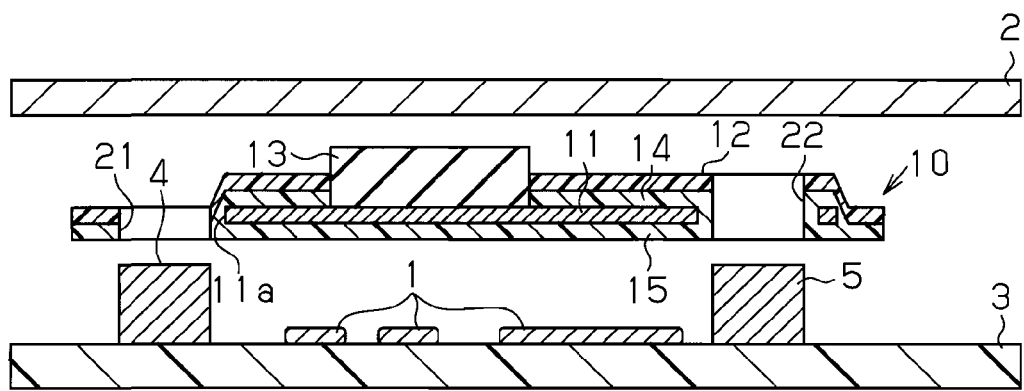
FIG. 3 is a cross-sectional view showing the thermal diffusion sheet in a state before being pasted to an electronic part.
Figure 4:
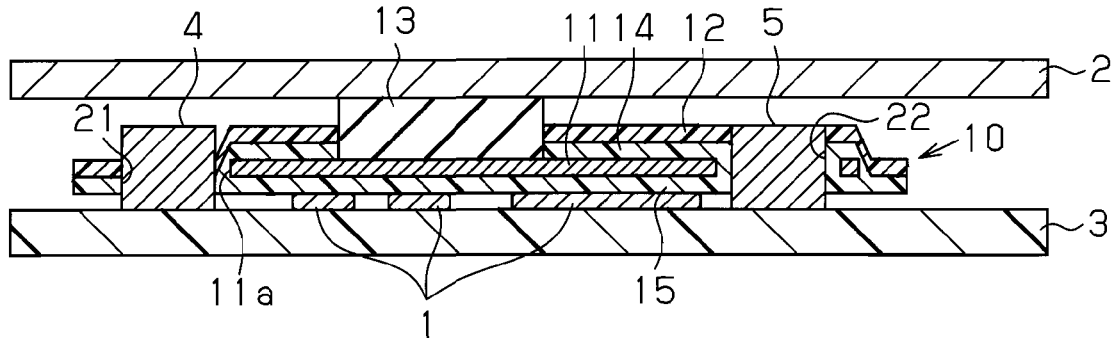
FIG. 4 is a cross-sectional view showing the thermal diffusion sheet in a state after being pasted to the electronic part.

As shown in FIGS. 3 and 4, the forms, the sizes and the locations of the first and second positioning portions 21 and 22 are designed in such a manner that protruding structures 4 and 5 placed in close proximity to the electronic parts 1 engage with the first and second positioning portions 21 and 22. It is preferable to use a material which does not generate heat as the structures 4 and 5 which engage with the two positioning portions 21 and 22, and specifically, the heads of screws can be cited as examples.

The above described thermal diffusion sheet 10 is placed for use so as to be located between the substrate 3, on which the electronic parts 1 are mounted, and the part 2, for example, the housing or a heat sink. That is to say, the thermal diffusion sheet 10 is used in a state where the graphite sheet 11 makes contact with the upper surface of the electronic parts 1 and the heat conductive rubber 13 makes contact with the rear surface of the above described part 2 and is compressed in the direction of the thickness. The heat generated from the electronic parts 1 in this state first diffuses throughout the entirety of the graphite sheet 11. Then, this heat is conducted to the part 2 through the heat conductive rubber 13 from the graphite sheet 11 and released to the surroundings of the part 2. In this manner, the heat generated by the electronic parts 1 keeps being radiated while diffusing throughout the graphite sheet 11. As a result, the temperature can be prevented from rising due to the heat generated by the electronic parts 1.

Next, a method for using the above described thermal diffusion sheet 10 is described in reference to FIGS. 3 and 4.

As shown in FIG. 3, first, peel-off sheets 16 and 17 (see FIGS. 1 and 2) are peeled off the thermal diffusion sheet 10. Next, the thermal diffusion sheet 10 is placed on the substrate 3, on which the electronic parts 1 are mounted. Then, as shown in FIG. 4, the structure 4 on the substrate 3 is engaged with the first positioning portion 21 and the structure 5 on the same substrate 3 is engaged with the second positioning portion 22, and at the same time, the thermal diffusion sheet 10 is pressed against the surface of the electronic parts 1. Then, the thermal diffusion sheet 10 is pasted and secured to the surface of the electronic parts 1 through the second adhesive layer 15. In this manner, the thermal diffusion sheet 10 is pasted in the location where the electronic parts 1 radiate heat most efficiently. Accordingly, the structures 4 and 5 placed in close proximity to the electronic parts 1 are engaged with the two positioning portions 21 and 22, and thus, the positioning of the thermal diffusion sheet 10 relative to the electronic parts 1 is easily and reliably carried out.

According to the present embodiment, the following advantages are gained.

(1) The thermal diffusion sheet 10 is provided with the two positioning portions 21 and 22, which are holes, in order to make positioning easy relative to the electronic parts 1. In this case, the structures 4 and 5 placed in close proximity to the electronic parts 1 are engaged with the two positioning portions 21 and 22, and thus, the positioning of the thermal diffusion sheet 10 relative to the electronic parts 1 can be carried out easily and without fail. Accordingly, the thermal diffusion sheet 10 can be pasted easily and without fail to the location which makes the electronic parts 1 radiate heat most efficiently in the manufacturing process for electronic devices or the like.

(2) The first and second positioning portions 21 and 22 are both placed in locations which do not overlap the graphite sheet 11 as viewed from the top. That is to say, the first and second positioning portions 21 and 22 are both holes through the polymer film 12 and the first and second adhesive layers 14 and 15. In this case, the graphite sheet 11 is not exposed from the two positioning portions 21 and 22, and therefore, the graphite powder peeled off the graphite sheet 11 is prevented from dispersing. Accordingly, problems, such as short circuiting of a conductive wire on the substrate 3, caused when the graphite powder comes off are prevented.

(3) The two sides and the outer periphery of the graphite sheet 11 as well as the inner peripheries of the notch 11a and the hole 11b are coated with an adhesive. In this case, the two sides of the graphite sheet 11 are both coated with the first and second adhesive layers 14 and 15, and therefore, the graphite powder peeled off the graphite sheet 11 is reliably prevented from dispersing.

(4) The hole 23 for placing the heat conductive rubber 13 is provided at the center of the polymer film 12. The heat conductive rubber 13 is placed directly on the graphite sheet 11 via this hole 23. That is to say, the heat conductive rubber 13 is placed so as to make contact with the surface of the graphite sheet 11 without the polymer film 12 in between. In this case, the heat that has diffused throughout the graphite sheet 11 from the electronic parts 1 can be released to the surroundings of the part 2, which is the housing or the like, via the heat conductive rubber 13. As a result, the heat generated by the electronic parts 1 can be efficiently radiated while being dispersed, and thus, the temperature can be prevented from rising due to the heat generated by the electronic parts 1.

Next, the tests which were conducted in order to confirm the effects of the heat conductive rubber are described concretely.

In the test example, a test sample of a thermal diffusion sheet was prepared using a graphite sheet, a PET film and a heat conductive rubber. Specifically, a graphite sheet, in which an acryl-based adhesive was applied to the two sides and a polymer film was pasted to one side, was punched out into a predetermined form, and heat conductive rubber was pasted to the thus gained formed body, and thus, the test sample was prepared. In the test example, a hole for placing heat conductive rubber was made at the center of the PET film, and heat conductive rubber was directly pasted to the graphite sheet via this hole. The thus gained test sample was placed so as to be located between a housing and a ceramic heater, and this test sample was compressed until the thickness became 0.5 mm. In this case, the test sample was placed between the housing and the ceramic heater with the heat conductive rubber making contact with the ceramic heater.

In the comparative example, no hole for placing heat conductive rubber was made in the PET film. Accordingly, heat conductive rubber was directly pasted to the polymer film without making contact with the graphite sheet. The same manufacturing method as in the test example, except for this point, was used to prepare a test sample. In order to prepare the respective test samples for the test example and the comparative example, a graphite sheet having a thickness of 80 μm, a PET film having a thickness of 20 μm and a heat conductive rubber having a thickness of 450 μm (a 10 mm square) were used. The respective test samples for the test example and the comparative example had the same area in the portion where the graphite sheet and the heat conductive rubber overlapped.

(Evaluation Test)

In each of the test samples for the test example and the comparative example, thermocouples were secured to the surface of the ceramic heater, to the graphite sheet directly above the ceramic heater and the outer periphery of the graphite sheet, respectively. Then, a voltage of 5 V was applied to the ceramic heater so that heat was emitted, and changes in the temperature in the ceramic heater and the graphite sheet were measured, and thus, an evaluation test for the heat properties was conducted. In the graph of FIG. 7, the two curving lines A indicate changes in the temperature on the surface of the ceramic heater, the two curving lines B indicate changes in the temperature on the graphite sheet directly above the ceramic heater, and the two curving lines C indicate changes in the temperature in the outer periphery of the graphite sheet. In addition, the solid lines from among the respective pairs of curving lines A, B and C indicate changes in the temperature in the test sample for the test example, and the dotted lines indicate changes in the temperature in the test sample for the comparative example. In addition, the thermal resistance and the thermal conductivity of each test sample for the test example and the comparative example were respectively obtained from the above described evaluation tests. The thermal resistance is a coefficient indicating the difficulty of thermal conductance. The thermal conductivity is a coefficient indicating the ease of thermal conductance. The results are shown in Table 1.

TABLE 1

|  | Example | Comparative example |
| --- | --- | --- |
| Thermal resistance (° C./W) | 2.08 | 3.15 |
| Thermal conductivity (W/mK) | 2.4 | 1.6 |

It was confirmed from the results of the graph in FIG. 7 that in the case of the test example, the rise in the temperature on the surface of the ceramic heater was kept low in comparison with the comparative example. This means that, since the thermal conductive rubber is directly pasted to the graphite sheet, heat tends to flow easily from the thermal conductive rubber to the graphite sheet and the heat from the ceramic heater is efficiently radiated. Meanwhile, in the case of the comparative example, there is a polymer film between the heat conductive rubber and the graphite sheet, and therefore, it is difficult for heat to flow from the heat conductive rubber to the graphite sheet and heat from the ceramic heater is not efficiently radiated. Such results were gained as shown in Table 1 that the test sample for the test example had lower thermal resistance and higher thermal conductivity than those of the test sample for the comparative example. No difference was observed in the change in the temperature of the graphite sheet directly above the ceramic heater and the outer periphery of the graphite sheet between the test example and the comparative example.

The above illustrated embodiment may be modified as follows.

Figure 5:
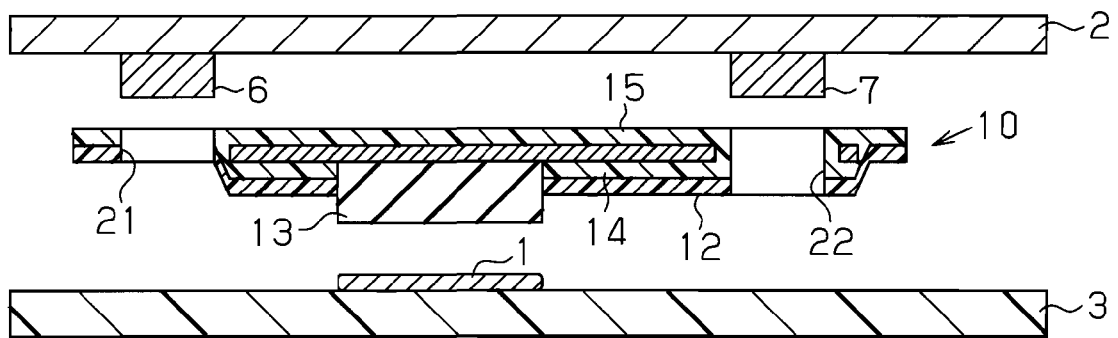
FIG. 5 is a cross-sectional view showing a structural arrangement of a thermal diffusion sheet according to another embodiment.

In the present embodiment the structures 4 and 5 on the substrate 3 are engaged with the first and second positioning portions 21 and 22, and thus, the positioning of the thermal diffusion sheet 10 relative to the electronic parts 1 is carried out. However, as shown in FIG. 5, structures 6 and 7 provided to the part 2, which is the housing or the like, may be engaged with the first and second positioning portions 21 and 22, and thus, the positioning of the thermal diffusion sheet 10 may be carried out.

Although in the present embodiment the first and second positioning portions are holes, the positioning portions may be notches.

Figure 6:
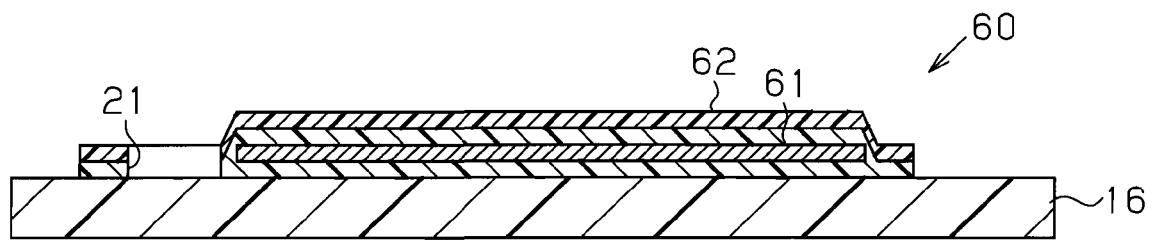
FIG. 6 is a cross-sectional view showing a thermal diffusion sheet according to another embodiment.

In the present embodiment the thermal diffusion sheet 10 is provided with the polymer film 12 and the heat conductive rubber 13 on the graphite sheet 11. However, as shown in FIG. 6, the heat conductive rubber 13 which is provided with the thermal diffusion sheet may be omitted if necessary. In addition, the number of positioning portions 21 may be one or may be three or more.

The form of the notch 11a and the hole 11b made in the graphite sheet 11 in the present embodiment may be modified to the form of, for example, a circle, an ellipse or a semi-circle.

The invention claimed is:

1. A thermal diffusion sheet, comprising:
    a graphite sheet for diffusing heat generated by a heat emitting body;
    a polymer film provided on the graphite sheet;
    a heat conductive rubber provided on the graphite sheet; and
    a positioning portion for carrying out positioning relative to the heat emitting body,
    wherein the polymer film includes a hole provided in the polymer film for placing the heat conductive rubber,
    wherein the heat conductive rubber is placed in the hole, and thus placed so as to make contact with the surface of the graphite sheet without the polymer film being present therebetween.

2. The thermal diffusion sheet according to claim 1, wherein an upper adhesive layer and a lower adhesive layer are provided on an upper surface and a lower surface of the graphite sheet, respectively, and
    wherein the polymer film is pasted to the graphite sheet through the upper adhesive layer, and the thermal diffusion sheet is pasted to the heat emitting body through the lower adhesive layer.

3. The thermal diffusion sheet according to claim 2, wherein the positioning portion is a hole through the polymer film and the upper and lower adhesive layers, the heat emitting body is placed on a substrate, and the positioning portion is engaged with a projecting structure placed on the substrate.

4. A method for positioning the thermal diffusion sheet according to claim 1 relative to a heat emitting body,
    wherein the positioning of the thermal diffusion sheet relative to the heat emitting body is carried out by engaging a structure placed in close proximity to the heat emitting body with the positioning portion.

* * * * *